Figure 1:
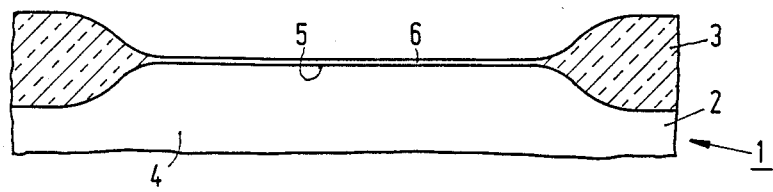

United States Patent [19]

Osinski et al.

[11] Patent Number: 4,885,259

[45] Date of Patent: Dec. 5, 1989

[54] METHOD OF MANUFACTURING A SEMICONDUCTOR DEVICE, IN WHICH METAL SILICIDE IS PROVIDED IN A SELF-REGISTERED MANNER

[75] Inventors: Kazimierz Osinski; Ingrid J. Voors, both of Eindhoven, Netherlands

[73] Assignee: U.S. Philips Corporation, New York, N.Y.

[21] Appl. No.: 290,923

[22] Filed: Dec. 28, 1988

[30] Foreign Application Priority Data

Jan. 29, 1988 [NL] Netherlands ............... 8800222

[51] Int. Cl.4 ............... H01L 21/00; H01L 21/02; H01L 21/285; H01L 21/26
[52] U.S. Cl. .................................... 437/41; 437/43; 437/44; 437/200; 437/202; 148/DIG. 147
[58] Field of Search ............. 437/41, 200, 202; 148/DIG. 147

[56] References Cited

U.S. PATENT DOCUMENTS

| 4,080,719 | 3/1978 | Wilting | 437/912 |
|---|---|---|---|
| 4,441,247 | 4/1984 | Gargini et al. | 437/192 |
| 4,477,310 | 10/1984 | Park et al. | 437/72 |
| 4,587,718 | 5/1986 | Haken et al. | 437/202 |
| 4,616,399 | 10/1986 | Ooka | 437/44 |
| 4,663,191 | 5/1987 | Choi et al. | 437/202 |
| 4,703,551 | 11/1987 | Szluk et al. | 437/44 |
| 4,740,484 | 4/1988 | Norström et al. | 437/202 |
| 4,755,478 | 7/1988 | Abernathey et al. | 437/41 |
| 4,786,609 | 11/1988 | Chen | 437/44 |
| 4,818,715 | 4/1989 | Chao | 437/44 |

Primary Examiner—Olik Chaudhuri
Assistant Examiner—B. Everhart
Attorney, Agent, or Firm—Paul R. Miller

[57] ABSTRACT

A method of manufacturing a semiconductor device comprising a field effect transistor having an insulated gate electrode (11) of doped polycrystalline silicon, which is provided on a surface (5) of a semiconductor substrate (1), in which further source and drain zones (17, 18) of the transistor are formed. The source and drain zones (17, 18) and the gate electrode (11) are provided in a self-registered manner with a top layer of a metal silicide (27). According to the invention, during the formation of the gate electrode (11) in a layer of polycrystalline silicon (7), an etching mask (10) containing silicon nitride is used. Thus, without the gate oxide (6) lying under the layer of polycrystalline silicon (7) being covered with organic residues that can be removed only with difficulty, a gate electrode (11) can be otained with side edges (12) directed transversely to the surface (5).

6 Claims, 3 Drawing Sheets

METHOD OF MANUFACTURING A SEMICONDUCTOR DEVICE, IN WHICH METAL SILICIDE IS PROVIDED IN A SELF-REGISTERED MANNER

The invention relates to a method of manufacturing a semiconductor device comprising an insulated gate field effect transistor, in which a surface of a semiconductor substrate of monocrystalline silicon is provided with a layer of silicon oxide, on which a gate electrode is formed by covering the layer of silicon oxide with a layer of doped polycrystalline silicon, which, after an etching mask has been provided, is subjected to an etching treatment, after which, using the gate electrode as a mask, source and drain zones are formed by ion implantation in the semiconductor substrate, the gate electrode is provided with edge isolation parts by covering the surface with a layer of silicon oxide and by then subjecting it to an anisotropic etching treatment, the polycrystalline silicon of the gate electrode and the monocrystalline silicon of the source and drain zones are exposed, the surface is covered with a metal-containing layer, the substrate is subjected to a heat treatment, in which a metal silicide is formed by reaction of the metal-containing layer with underlying mono- and polycrystalline silicon, and parts of the metal-containing layer not converted into metal silicide are etched away.

During the heat treatment, in which the metal-containing layer reacts with the monocrystalline silicon of the source and drain zones and with the polycrystalline silicon of the gate electrode, which results in a metal silicide being formed, such a reaction does not occur between the metal-containing layer and silicon oxide. Parts of the metal-containing layer present above the edge isolation parts of the gate electrode are then not converted into metal silicide. These parts can be etched away without the metal silicide formed being attacked in practice. Thus, the source and drain zones and the gate electrode are provided in a self-registered manner with a top layer of metal silicide. Due to this top layer, the source and drain zones can be contacted at a comparatively low resistance and the gate electrode has a comparatively low resistance.

U.S. Pat. No. 4,477,310 discloses a method of the kind mentioned in the opening paragraph, in which during the formation of the gate electrode in the layer of doped polycrystalline silicon an etching mask of photoresist is used.

It has been found that the use of an etching mask of photoresist in practice leads to a number of disadvantages. During the step of etching the comparatively thick layer of polycrystalline silicon, the photoresist can be attacked, as a result of which the gate electrode formed obtains side edges which are arranged obliquely to the surface. Consequently, it is difficult to provide the gate electrode with suitable edge isolation parts, as a result of which during the formation of metal silicide there is the risk that the source and drain zones are electrically connected to the gate electrode. Moreover, the use of photoresist for the etching mask has the disadvantage that polymeric residues are left on the surface, which can be removed only with difficulty.

The invention has inter alia for its object to provide a method, by which these disadvantages are obviated.

According to the method, the method of the kind mentioned in the opening paragraph is for this purpose characterized in that during the formation of the gate electrode in the layer of polycrystalline silicon a mask containing silicon nitride is used as an etching mask. It has been found that with the use of an etching mask containing silicon nitride the gate electrode can be realized with substantially straight side edges which extend substantially transversely to the surface of the semiconductor substrate. As a result, such edge isolation parts can be provided in a simple manner on the gate electrode that during the formation of metal silicide the risk of shortcircuit of source and drain zones and gate electrode is practically avoided. The use of a layer containing silicon nitride moreover has the advantages that the etching mask prevents oxidation of the underlying polycrystalline silicon and that the etching mask can be etched away selectively with respect to the monocrystalline silicon of the source and drain zones, the polycrystalline silicon of the gate electrode and the silicon oxide of the edge isolation parts.

Preferably, the method according to the invention is characterized in that the etching mask containing silicon nitride is not removed until the source and drain zones are formed. During the ion implantation to be carried out after the formation of the gate electrode, the monocrystalline silicon must be protected. This is effected very efficaciously by a layer of silicon oxide formed by thermal oxidation on the monocrystalline silicon. Defects formed during the implantation in the crystal lattice can be removed efficaciously after the implantation by a heat treatment carried out in oxygen. During such oxidation treatments, the gate electrode is covered on its upper side by the mask of material containing silicon nitride, as a result of which oxidation of the gate electrode on its upper side is prevented. If this should not be the case, there would be formed on the gate electrode of doped polycrystalline silicon during the oxidation treatments a layer of oxide which would be considerably thicker than that on the monocrystalline silicon. During the process of exposing the monocrystalline and polycrystalline silicon, the substrate would then have to be subjected to an etching treatment for an unnecessarily long time. As a result, for example, edges of field insulation regions would be etched away over an unnecessarily large distance. This is prevented by the measure according to the invention.

The mask containing silicon nitride may be a mask which is formed in the top layer of the layer of polycrystalline silicon, which is converted by nitridation or by an ion implantation at least in part into silicon nitride. The mask may also be formed in a layer of silicon oxynitride. Preferably, however, as mask containing silicon nitride a mask of silicon nitride is used. A mask of silicon nitride provides optimum protection from oxidation and can be etched away very selectively with respect to silicon and silicon oxide.

Figure 2:
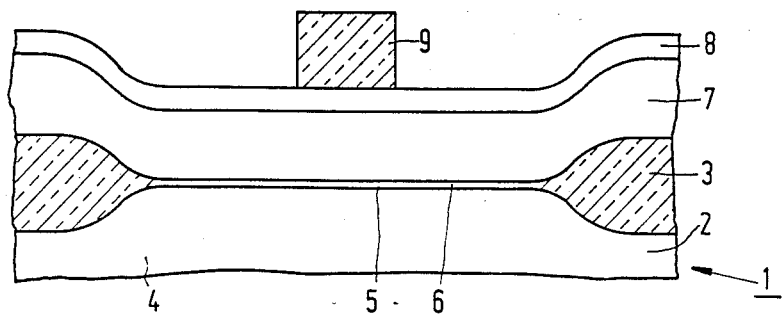
Figure 3:
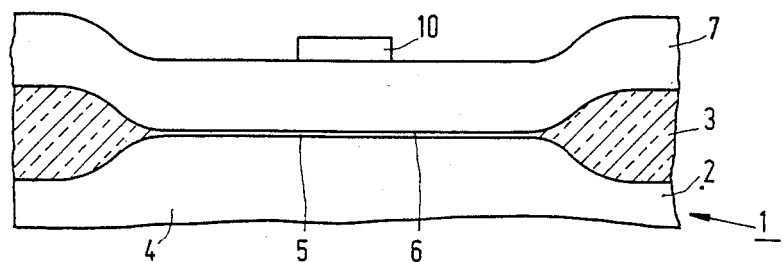
Figure 4:
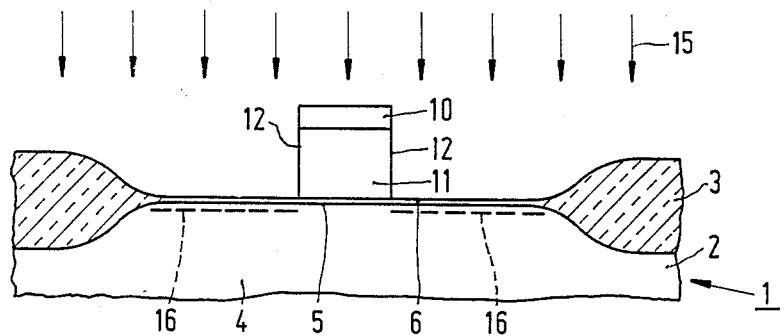
Figure 5:
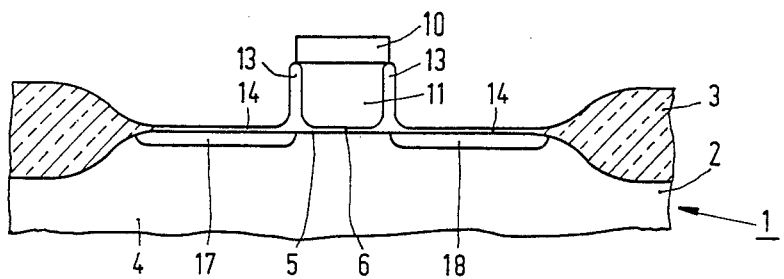
Figure 6:
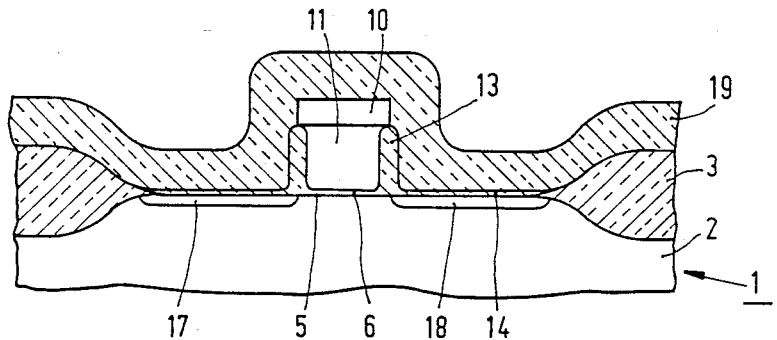
Figure 7:
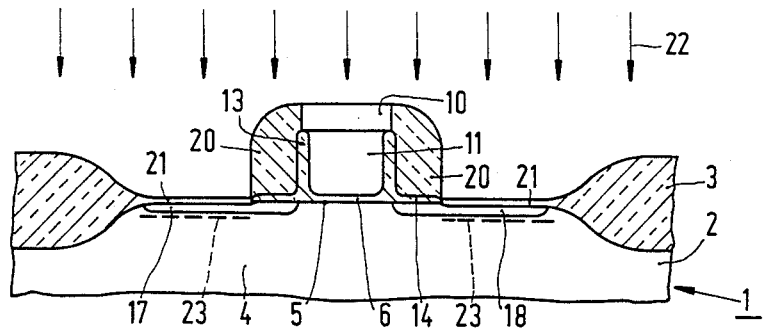
Figure 8:
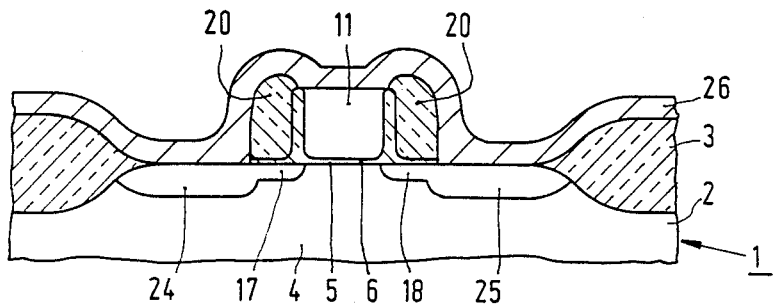
Figure 9:
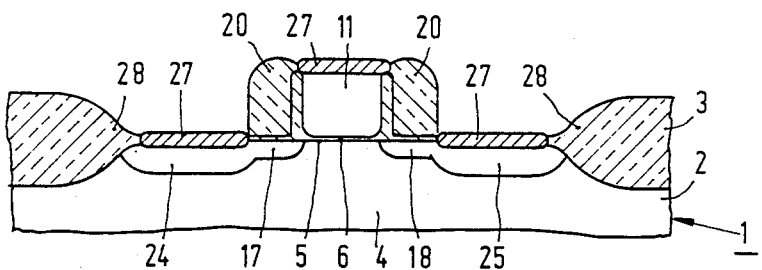

The invention will be described more fully hereinafter, by way of example, with reference to a drawing. In the drawing:

FIGS. 1 to 9 show diagrammatically and in cross-section a few successive stages of manufacture of a semiconductor device obtained by means of the method according to the invention.

FIGS. 1 to 9 show diagrammatically and in cross-section a few stages of manufacture of a semiconductor device comprising an insulated gate field effect transistor by means of the method according to the invention. The starting material is a semiconductor substrate 1 of monocrystalline silicon. In the Figures, a part of a top layer 2 thereof having the p-conductivity type, a doping concentration of about $10^{15}$ atoms/cm$^3$ and a thickness of about 4 μm is shown, which is provided on an underlying layer (not shown) of the p-conductivity type having a doping concentration of about $10^{19}$ atoms/cm$^3$. In a usual manner, field oxide regions 3 enclosing semiconductor regions 4 are provided in the substrate 1. In the Figures, only one these regions 4 is shown; in practice, a semiconductor device comprises many of such regions.

The substrate 1 is now heated for 30 minutes in dry oxygen, while a thin layer of silicon oxide 6 having a thickness of about 20 nm is formed on its surface 5.

A gate electrode 11 is formed on the layer of silicon oxide 6 by covering the layer 6 with a layer 7 of polycrystalline silicon doped with about $10^{20}$ phosphorus atoms/cm$^3$ and having a thickness of about 500 nm, which is subjected, after an etching mask 10 has been provided, to an etching treatment. According to the invention, a mask containing silicon nitride is used as etching mask 10. This mask is formed by covering the layer of polycrystalline silicon 7 in a usual manner with a layer of silicon nitride 8 having a thickness of about 150 nm. In a usual manner, after masking with a photoresist mask 9, the etching mask 10 is formed therein by a plasma etching treatment with fluorine ions. Such an etching mask containing silicon nitride may also be formed in different ways, for example in a layer of silicon oxynitride or in a top layer of the layer of polycrystalline silicon 7, which is converted by implantation of nitrogen ions at least in part into silicon nitride. Preferably, however, the etching mask 10 is formed in the manner described above. In order to guarantee a satisfactory adherence of the layer of silicon nitride 8 to the layer of polycrystalline silicon 7 during further processing steps, a layer of silicon oxide having, for example, a thickness of about 15 nm is preferably provided between the two layers. This layer, which is not shown in the drawings, may be obtained by oxidation of the layer of polycrystalline silicon 7.

After masking with the etching mask 10, which according to the invention is a mask containing silicon nitride, the gate electrode 11 is now formed by a plasma etching treatment with chlorine ions. It has been found that a gate electrode 11 can thus be obtained having practically straight side edges 12, which extend practically transversely to the surface 5. As will appear from the following description, such edge isolation parts 20 can thus be provided in a simple manner on the gate electrode 11 so that during the formation of metal silicide the risk of shortcircuits is very small. The use of silicon nitride for the etching mask 10 moreover has the advantage that the etching mask 10 prevents oxidation of the underlying polycrystalline silicon and that the etching mask can be etched away selectively with respect to monocrystalline silicon, polycrystalline silicon and silicon oxide.

After the formation of the gate electrode 11, an ion implantation indicated diagrammatically by arrows 15 is carried out, in which, after masking the gate electrode 11 and the field oxide regions 3, ions designated by reference numeral 16 are implanted into the semiconductor region 4. In this case, phosphorus ions at an energy of 50 keV and a dose of $10^{13}$ ions/cm$^2$ are implanted. In order to remove defects of the crystal lattice of the substrate, the substrate is heated for about 40 minutes to about 925°C. in dry oxygen. Silicon oxide layers 13 are then formed on the uncovered side edges 12 of the gate electrode 11 and the parts 14 of the layer of silicon oxide 6, which are located between the gate electrode 11 and the field oxide regions 3, obtain a thickness of about 35 nm. At the same time, semiconductor zones 17 and 18 are formed. These zones constitute the source and drain zones of the field effect transistor.

Subsequently, the gate electrode 11 is provided with edge isolation parts 20 by covering the surface 5 with a layer of silicon oxide 19 having a thickness of about 300 nm, by heating the substrate to a temperature of 700° C. in a gas mixture containing tetraethyl orthosilicate and by then subjecting it to an anisotropic etching treatment with reactive ions. This etching treatment is stopped when the oxide has been removed from the monocrystalline silicon of the semiconductor zones 17 and 18.

The substrate 1 is now heated again for about 40 minutes to about 925° C. in dry oxygen. The layers of silicon oxide 21 having a thickness of about 25 nm located above the semiconductor zones 17 and 18 are then formed. These parts 21 protect the semiconductor region 4 again during an ion implantation indicated diagrammatically by arrows 22. After masking the gate electrode 11, the edge isolation parts 20 and the field oxide regions 3, ions indicated by reference numeral 23 are now implanted into the semiconductor region 4. In this case, these ions are arsenic ions at an energy of 50 keV and a dose of $10^{15}$ ions/cm$^2$. After a heat treatment of 60 minutes at a temperature of 925° C., more heavily doped connection zones 24 and 25 for the source and drain zones 17 and 18 are formed.

After the formation of the doped zones 24 and 25, the mask 10 (with the layer of silicon oxide possibly located under it), and the layers of silicon oxide 21 are etched away, or in other words: the polycrystalline silicon of the gate electrode 11 and the monocrystalline silicon of the connection zones are exposed. The substrate 1 is now covered by a metal-containing layer 26, such as, for example, a layer of titanium. Subsequently, the substrate 1 is subjected for about 10 seconds to a heat treatment at a temperature of about 650° C. in a nitrogen atmosphere. The metal-containing layer 26 then reacts with underlying silicon 11, 24, 25, but it does not react with underlying silicon oxide 3, 20. At the last-mentioned areas, a nitridized titanium layer is formed, which can then be etched away selectively in a solution of ammonia and hydrogen peroxide. After a further short heat treatment of about 10 seconds, at about 850° C., the gate electrode 11 and the zones 24 and 25 are provided in a self-registered manner with a top layer 27, the source and drain zones 17 and 18 can be contacted at a comparatively low resistance and the gate electrode 11 with the associated top layer has a comparatively low resistance.

According to the invention, the etching mask 10 containing silicon nitride is removed only after the source and drain zones 17 and 18 and the associated connection zones 24 and 25 have been formed. Thus, it is avoided that during the formation of the oxide layers 14 and 21 the gate electrode 11 oxidizes on its upper side. If this were not the case, about 150 nm of oxide would have been formed on the polycrystalline silicon during the heat treatments in which about 60 nm of silicon oxide in all has been formed on the monocrystalline silicon. Polycrystalline silicon doped with phosphorus oxidizes in dry oxygen much more rapidly than monocrystalline silicon. Both kinds of silicon oxide are attacked at a substantially equal rate by etchants, however. If the gate electrode 11 were not covered with the mask 10 of silicon nitride, 150 nm of silicon oxide would have to be etched away before the metal-containing layer 26 could be provided. Now that the gate electrode according to the invention is covered with the mask 10, however, only 60 nm of silicon oxide need be removed. Thus, it is avoided that the field oxide regions 3 and the edge isolation parts 20 are etched for an unnecessarily long time during the process of exposing the zones 24 and 25 and the gate electrode 11. Especially edges 28 of the field oxide regions 3 could be attacked to such an extent that the pn junctions between the connection zones 24 and 25 and the semiconductor region 4 could be exposed. These junctions would then be shortcircuited by metal silicide. This risk is greater if the pn junction extends in close proximity of the surface 5, which is the case especially with transistors having submicron dimensions.

By the use of the etching mask 10 of silicon nitride, a gate electrode 11 can be obtained with straight side edges 12 directed transversely to the surface. The edge isolation regions 20 then have a thickness which is larger than if the side edges should extend obliquely to the surface. This would have been the case if the gate electrode would have been formed directly with a photoresist mask (and not with the intermediary of the mask 10 of silicon nitride). Due to the large thickness of the side isolation parts 20, the risk of shortcircuit between the top layers of metal silicide 27 is a minimum.

What is claimed is:

1. A method of manufacturing a semiconductor device including an insulated gate field effect transistor comprising the steps of
   (a) providing a layer of silicon oxide on a surface of a semiconductor substrate of monocrystalline silicon,
   (b) covering said layer of silicon oxide with a layer of doped polycrystalline silicon,
   (c) forming a mask containing silicon nitride on said layer of doped polycrystalline silicon,
   (d) etching said layer of doped polycrystalline silicon to said layer of silicon oxide using said mask as an etching mask to form a gate electrode of said doped polycrystalline silicon under said etching mask,
   (e) maintaining said etching mask on said gate electrode,
   (f) forming source and drain zones in said monocrystalline silicon of said semiconductor substrate using said etching mask,
   (g) forming edge isolation parts about sides of said gate electrode by the steps of covering said surface with a further layer of silicon oxide and anisotropically etching said further layer,
   (h) removing said etching mask by exposing said polycrystalline silicon of said gate electrode, and exposing said source and drain zones by removing any remaining layer of silicon oxide,
   (i) covering said gate electrode and said source and drain zones with a layer of metal-containing material,
   (j) forming a metal silicide from said metal-containing layer contacting said gate electrode and said source and drain zones by heating and reacting said metal-containing layer with said polycrystalline silicon of said gate electrode and with said monocrystalline silicon of said source and drain zones, and
   (k) removing any parts of said metal-containing layer free of contact with said polycrystalline silicon gate electrode or with said monocrystalline silicon source and drain zones.

2. A method as claimed in claim 1, characterized in that the etching mask containing silicon nitride is removed only after the source and drain zones have been formed.

3. A method as claimed in claim 1 or 2, characterized in that said etching mask containing silicon nitride is silicon nitride.

4. A method as claimed in claim 3, characterized in that said etching mask of silicon nitride is formed by covering said layer of polycrystalline silicon with a layer of silicon nitride, by forming a photoresist mask on said layer of silicon nitride, by etching said silicon nitride free of said photoresist mask, and by removing said photoresist mask.

5. A method as claimed in claim 4, characterized in that a layer of silicon oxide is provided between the layer of polycrystalline silicon and the layer of silicon nitride.

6. A method as claimed in claim 1 or 2, characterized in that associated connection zones are formed with said source and drain zones before removing said etching mask.

* * * * *